United States Patent [19]

Fukuchi

[11] 4,365,207
[45] Dec. 21, 1982

[54] INTEGRATED HIGH FREQUENCY AMPLIFIER

[75] Inventor: Satoshi Fukuchi, Tachikawa, Japan

[73] Assignee: Hitachi Denshi Kabushiki Kaisha, Tokyo, Japan

[21] Appl. No.: 233,117

[22] Filed: Feb. 10, 1981

[30] Foreign Application Priority Data

Feb. 18, 1980 [JP] Japan .................................. 55-18819

[51] Int. Cl.³ .......................... H03F 3/45; G06G 7/18
[52] U.S. Cl. ..................................... 330/260; 328/128
[58] Field of Search ......................... 330/260, 85, 307; 328/128

[56] References Cited

U.S. PATENT DOCUMENTS 3,986,127 10/1976 Ray ..................................... 328/128

Primary Examiner—James B. Mullins
Assistant Examiner—Gene Wan
Attorney, Agent, or Firm—Blakely, Sokoloff, Taylor & Zafman

[57] ABSTRACT

The integrated high frequency amplifier comprises a low pass band type feedback circuit connected between input and output terminals of the high frequency amplifier. The feedback circuit comprises a resistor and a capacitor which act as a Miller integrating circuit.

5 Claims, 5 Drawing Figures

INTEGRATED HIGH FREQUENCY AMPLIFIER

BACKGROUND OF THE INVENTION

This invention relates to an integrated high frequency amplifier incorporated with a feedback circuit.

In an integrated circuit (IC), since it is generally difficult to provide for a high frequency high gain amplifier and AC coupling, all stages of the amplifier, that is from the first to the last stages are directly connected. As a consequence, a gain at a low frequency which is not necessary to the inherent purpose of a high frequency amplifier is also obtained at the same time. In such case, variation in the offset presents a problem. For example, in an amplifier having a gain of 60 dB, an offset voltage of 2 mV at the input stage results in a bias variation of 2 V(2 mV×1000) at an output terminal which causes saturation of the amplifier in a certain case. A negative feedback is generally used for improving such offset variation.

In an amplifier circuit including a number of gain stages whether the feedback should be applied locally, in other words for individual gain stages or to the whole amplifier circuit or not is determined depending upon the field of use of the integrated circuit. In any case, it is necessary to decrease low frequency gain which is not necessary to the inherent purpose of the high frequency amplifier while at the same time to improve variation caused by the offset.

One example of a prior art negative feedback amplifier generally utilized in an integrated circuit is shown in FIG. 1, and the gain-frequency characteristic of this negative feedback circuit is shown in FIG. 2. As shown in FIG. 1, there are provided a pair of NPN transistors Q1 and Q2 with their emitter electrodes commonly connected. These transistors constitute a differential amplifier for amplifiying a high frequency signal, in which an input signal is applied to the input terminal or base electrode of one transistor and a feedback signal is applied to the input terminal or base of the other transistor. An NPN transistor Q3 is provided for amplifying the output of the transistor Q2. Serially connected feedback resistor Rf and an integrating resistor Ri and capacitor Ci comprise a low pass band type feedback circuit. IN represent an input terminal adapted to receive the input signal and OUT an output terminal.

In this circuit, suppose now that the differential amplifier has a sufficiently high gain without the feedback circuit, then the gain G of this circuit is determined by the following equation:

$$G \simeq 1 + Rf/\left(Ri + \frac{1}{Ci}\right)$$

Thus, within a range of $Ri >> 1/Ci$ the gain G would become $$G \simeq 1 + \frac{Rf}{Ri}$$

showing that the gain is constant irrespective of the frequency.

The gain-frequency characteristic is shown in FIG. 2 in which the ordinate represents the gain and the abscissa represents the frequency. As shown, at frequencies above frequency f2 the gain is constant. The point f2 at which the gain begins to decrease in the low frequency range is shown by the following equation:

$$f2 = \tfrac{1}{2}\pi Ci \cdot Ri$$

The frequency f1 at which the gain becomes substantially unity in the low frequency range is given by $$f1 = \tfrac{1}{2}\pi Ci(Ri + Rf)$$

In a low frequency range in which the offset causes a problem, $Ri << (1/\omega Ci)$ and $G=1$. Since the value of the offset voltage in the input stage appears as it is at the output terminal OUT, the variation caused by the offset described above can be improved and it is also possible to decrease unwanted gain in a low frequency range lower than f2.

The result of experiment made on the circuit shown in FIG. 1 shows that a gain of 12 dB can be obtained in a frequency range of from 5 MHz to 80 MHz. In this case, $Rf = 1 k\Omega$, $Ri = 220 \Omega$ and $Ci = 220 pF$ are given as illustrative feedback circuit constants.

However, when this circuit is constructed as a monolithic IC, large tip area is required to obtain large capacitance such as 220 pF in the IC, thus increasing the manufacturing cost. For this reason the capacitor Ci was constructed as a component outside of the integrated circuit.

In an integrated circuit having several gain stages each having a construction described above not only the number of the external capacitance increases but also the number of the output terminals increases thus increasing the size of the integrated circuit package.

SUMMARY OF THE INVENTION

Accordingly, it is an object of this invention to provide for an integrated high frequency amplifier capable of incorporating a feedback capacitor into the integrated circuit by utilizing Miller integration effect.

According to this invention, there is provided an integrated high frequency amplifier comprising a low pass band type feedback circuit connected between input and output terminals of the high frequency amplifier, the feedback circuit being constituted by a resistor and a capacitor which act as a Miller integrating circuit.

DESCRIPTION OF THE PREFERRED EMBODIMENT

Figure 1:
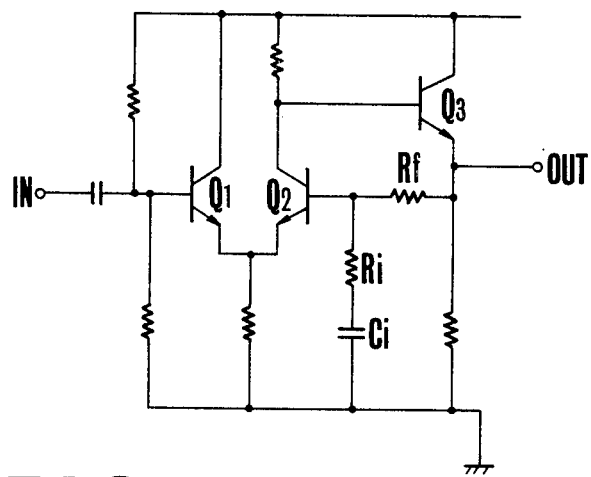
FIG. 1 is a connection diagram showing one example of a prior art feedback amplifier circuit.
Figure 3:
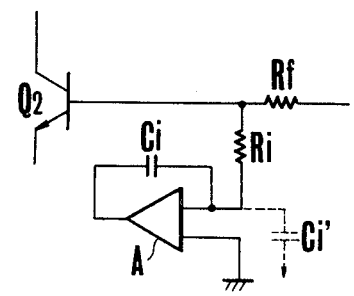
FIG. 3 is a connection diagram showing the basic construction of the feedback circuit utilized in the integrated circuit of the present invention.

In FIG. 3 circuit elements corresponding to those shown in FIG. 1 are designated by the same reference charactors, and in which an integrating amplifier having a negative gain $-\mu$(negative phase) is designated by A. A capacitor Ci is connected between the input and output terminals of the integrating amplifier A. Then it can be considered that a capacitor having an equivalent capacitance of μ(gain) times of that of the capacitor Ci were connected to the input terminal of the amplifier A. Thus, the equivalent capacitance is expressed by $Ci'=(1+\mu)Ci$ which is caused by so-called Miller integration effect of a Miller integrating circuit utilizing a source impedance and a constant current charging of a capacitor due to the feedback function of the amplifier.

Accordingly, the capacitance value of the capacitor Ci for obtaining the same characteristic as that of the prior art circuit shown in FIG. 1 may be $1/(1+\mu)$ where μ represents the gain of the integrating amplifier A. Assuming 20 times of the gain of the integrating amplifier A the capacitance of the capacitor Ci of the circuit shown in FIG. 1 would be 220 pF whereas the capacitance of the capacitor Ci would be only 10 pF.

In this manner, according to this invention it is possible to decrease the capacitance of a capacitor utilized in a feedback circuit.

Figure 4:
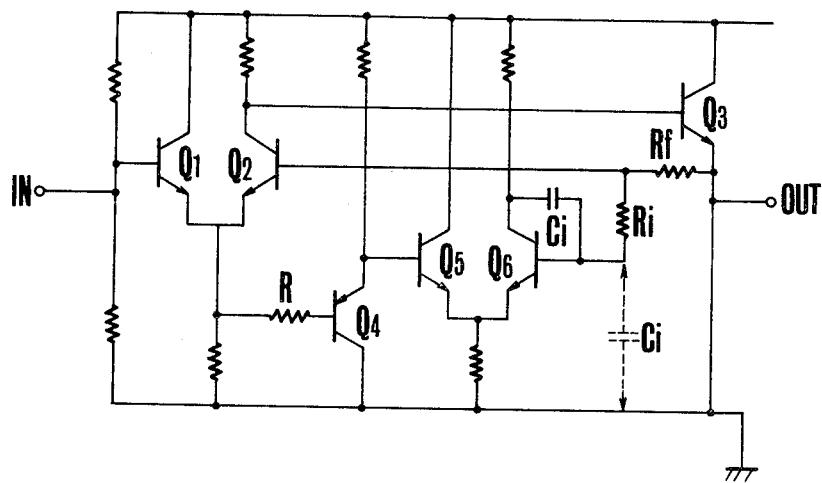
FIG. 4 is a connection diagram showing one embodiment of this invention.

In a preferred embodiment of this invention shown in FIG. 4, elements corresponding to those shown in FIGS. 1 and 3 are designated by the same reference characters. In FIG. 4, there are provided a pair of NPN transistors Q5 and Q6 with their emitter electrodes commonly connected. The base electrode of transistor Q6 is connected to the emitter electrode of the transistor Q3 via resistors Ri and Rf and to its own collector electrode via capacitor Ci. The transistors Q5 and Q6 constitute a differential integrating amplifier. A low frequency ($f_T$) PNP transistor Q4 is provided having an emitter ground current amplification factor $h_{FE}$ of unity. This transistor Q4 is used for level shifting and constructed to compensate for the base-emitter voltage $V_{BE}$ of transistor Q2 and for making equal the base bias voltages of the transistors Q5 and Q6 which constitutes the differential type integrating amplifier. The transistor Q4 is also constructed such that a low pass filter constituted by an input resistor R connected to its base electrode and a base input capacitance prevents a high frequency signal from appearing at the base electrode of the transistor Q5. More particularly, a differential amplifier formed by transistors Q5 and Q6 are used as a Miller integrating circuit, the emitter electrode of an emitter follower constituted by a PNP transistor Q4 is connected to the base electrode of transistor Q5 on the side opposite the base electrode of transistor Q6 performing Miller integration, while the base input terminal of the emitter follower is connected via resistor R to the feedback input terminal of the high frequency amplifier, that is the emitter electrode of the transistor Q2.

Figure 2:
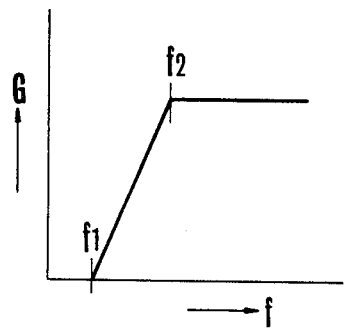
FIG. 2 is a graph showing a frequency-gain characteristic of the feedback amplifier circuit shown in FIG. 1.

The cutoff frequency of the low pass filter is set to be substantially equal to the low band frequency f2 (see FIG. 2) of the amplifier. Such frequency setting can also be made with a required capacitance by selecting a suitable resistance value for the resistor R.

The embodiment shown in FIG. 4 operates as follows. Thus, at a frequency lower than the cutoff frequency of the low pass filter constituted by the base input resistor R of transistor Q4 and the base input capacitance, a signal leaks into the base electrode of transistor Q5. Considering the base input terminal of the transistor Q6 under this state, at a frequency lower than the cutoff frequency f2 of the low pass type feedback circuit constituted by resistors Rf and Ri and the equivalent capacitance Ci, the signal also flows to the base electrode of the transistor Q6. Since this signal has the same phase as that at the base electrode of transistor Q5, the base voltages of transistors Q5 and Q6 constituting the differential type integrating amplifier vary at the same phase so that these transistors do never saturate.

Figure 5:
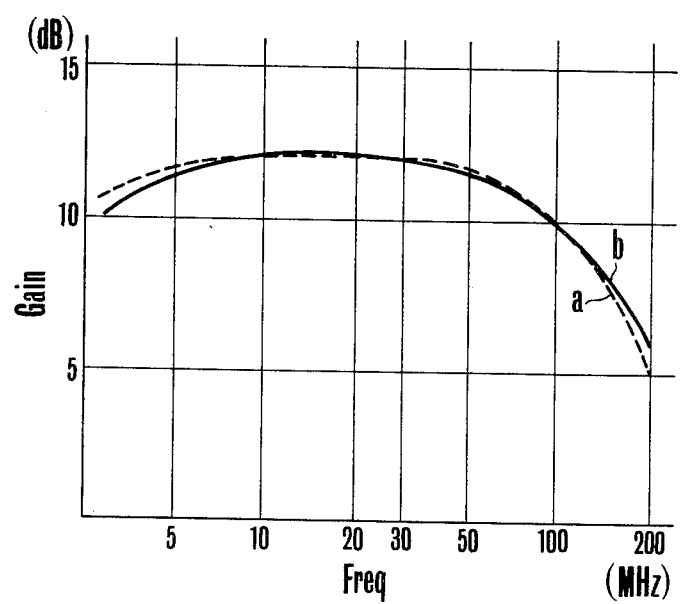
FIG. 5 shows frequency-gain characteristics comparing the present invention with the prior art feedback amplifier.

FIG. 5 shows gain-frequency characteristics in which the ordinate represents the gain and the abscissa the frequency and in which a broken line a shows the characteristic of the prior art circuit, while curve b that of the circuit embodying the invention.

In the prior art circuit shown in FIG. 1 and having the characteristic a shown in FIG. 5 the capacitance of the capacitor Ci necessary to obtain a frequency of 5 MHz through 80 MHz and a gain of 12 dB was 200 pF, whereas in the circuit shown in FIG. 4, it was possible to obtain the characteristic b shown in FIG. 5 which is substantially equal to that a of the prior art circuit.

In the embodiment described above reduction of the capacitance of the capacitor from 200 pF to 1/20, that is 10 pF means the reduction of the chip area of the integrated circuit, which is used as a capacitor, to 1/20 whereby it becomes possible to provide a required capacitance by the integrated circuit without increasing the tip area. This not only reduces the number of the output terminals but also miniaturizes the size of the integrated circuit package and eliminates external capacitance.

What is claimed is:

1. A high frequency integrated amplifier comprising:
    a low pass band type feedback circuit coupled between input and output terminals of said high frequency amplifier, said feedback circuit including a first resistor and a capacitor which act as a Miller integrating circuit;
    said Miller integrating circuit comprises a differential amplifier;
    a first transistor operating as an emitter follower the emitter terminal of said first transistor being coupled to the base terminal of a second transistor, said second transistor being part of said differential amplifier;
    the base terminal of said first transistor being coupled through a second resistor to the emitter terminal of a third transistor, said third transistor being coupled to a feedback terminal of said high frequency amplifier.

2. An integrated high frequency amplifier comprising a pair of first and second transistors with their emitter electrodes connected in common, said first and second transistors constituting a differential amplifier; a third transistor, a resistor connecting a base electrode of said third transistor to said commonly connected emitter electrodes in an emitter follower fashion, fourth and fifth transistors, means for connecting a base electrode of said fourth transistor to an emitter electrode of said third transistor, a sixth transistor with its base electrode connected to a collector electrode of said second transistor, serially connected resistors connected between a base electrode of said fifth transistor and an emitter electrode of said sixth transistor, means for connecting a junction between said serially connected resistors to a base electrode of said second transistor, a capacitor connected between base and collector electrodes of said fifth transistor, said fourth and fifth transistors, said serially connected resistors, and said capacitor constituting a differential integrating amplifier, means for applying an input signal to a base electrode of said first transistor, and means for deriving out an output from the emitter electrode of said sixth transistor.

3. The integrated amplifier according to claim 2 wherein said third transistor comprises a low frequency transistor having an emitter grounded current amplification factor of unity.

4. The integrated amplifier according to claim 2 wherein said resistor connected to the base electrode of said third transistor and a capacitance of said base electrode constitute a low pass filter which prevents a high frequency signal from appearing at the base electrode of said fourth transistor.

5. The integrated high frequency amplifier according to claim 4 wherein a cutoff frequency of said low pass filter is set to lie in a low frequency range of the amplifier.

* * * * *